United States Patent
Gao

(10) Patent No.: US 11,398,185 B2
(45) Date of Patent: Jul. 26, 2022

(54) DISPLAY PANEL, CONTROL METHOD THEREOF, AND DISPLAY DEVICE

(71) Applicant: SEEYA OPTRONICS CO., LTD., Shanghai (CN)

(72) Inventor: Zhiyang Gao, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 0 days.

(21) Appl. No.: 17/465,224

(22) Filed: Sep. 2, 2021

(65) Prior Publication Data

US 2022/0208092 A1    Jun. 30, 2022

(30) Foreign Application Priority Data

Dec. 28, 2020  (CN) .......................... 202011581216.3

(51) Int. Cl.
*G09G 3/3225* (2016.01)
*H01L 51/52* (2006.01)
*H01L 27/32* (2006.01)

(52) U.S. Cl.
CPC ....... *G09G 3/3225* (2013.01); *H01L 27/3218* (2013.01); *H01L 51/5212* (2013.01);
(Continued)

(58) Field of Classification Search
CPC ......... G09G 3/3225; G09G 2300/0452; G09G 2320/041; G09G 2320/0666; H01L 27/3218; H01L 51/5212; H01L 51/5228
See application file for complete search history.

(56) References Cited

U.S. PATENT DOCUMENTS 7,986,098 B2 * 7/2011  Tada .................... G09G 3/3233
                                                   315/307
2006/0202913 A1  9/2006  Hayafuji
(Continued)

FOREIGN PATENT DOCUMENTS

CN        101371619 A    2/2009
CN        105280684 A    1/2016
(Continued)

OTHER PUBLICATIONS

Chinese Office Action dated Aug. 13, 2021 in connection with Chinese Application No. 202011581216.3.

*Primary Examiner* — Michael J Jansen, II
(74) *Attorney, Agent, or Firm* — Wolf, Greenfield & Sacks, P.C.

(57) ABSTRACT

Provided are a display panel, a control method thereof, and a display device. The control method includes: acquiring a correspondence between temperature and voltage information of a first cathode of a first sub-pixel among a plurality of first sub-pixels, a correspondence between temperature and information about a voltage difference between an auxiliary electrode and the first cathode, and current temperature information of the display panel; and determining voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode so as to adjust the voltage difference between the first cathode and the auxiliary electrode so that a display color purity of the first sub-pixels meets a preset requirement.

9 Claims, 11 Drawing Sheets

(52) U.S. Cl.
CPC . *H01L 51/5228* (2013.01); *G09G 2300/0452* (2013.01); *G09G 2320/041* (2013.01); *G09G 2320/0666* (2013.01)

(56) References Cited

U.S. PATENT DOCUMENTS

| | | | | |
|---|---|---|---|---|
| 2008/0290806 A1* | 11/2008 | Tada | ............ | G09G 3/3233 |
| | | | | 315/307 |
| 2016/0189634 A1* | 6/2016 | Kim | ............ | G09G 3/3406 |
| | | | | 345/691 |
| 2018/0330669 A1* | 11/2018 | Zheng | ............ | G09G 3/3258 |
| 2019/0386252 A1 | 12/2019 | Jou et al. | | |

FOREIGN PATENT DOCUMENTS

| | | | |
|---|---|---|---|
| CN | 105428391 A | 3/2016 | |
| CN | 105741773 A | 7/2016 | |
| CN | 106910461 A | 6/2017 | |
| CN | 107579102 A | 1/2018 | |
| CN | 108878665 A | 11/2018 | |
| CN | 111223891 A | 6/2020 | |

\* cited by examiner

DISPLAY PANEL, CONTROL METHOD THEREOF, AND DISPLAY DEVICE

RELATED APPLICATIONS

This application claims foreign priority benefits under 35 U.S.C. § 119(a)-(d) or 35 U.S.C. § 365(b) to Chinese patent application No. 202011581216.3 filed on Dec. 28, 2020, the disclosure of which is incorporated herein by reference in its entirety.

TECHNICAL FIELD

Embodiments of the present disclosure relate to the field of display technologies and, in particular, to a display panel, a control method thereof, and a display device.

BACKGROUND

Organic light emitting diodes (OLED) have the characteristics of self-luminescent, fast response, wide color gamut, wide viewing angle, high brightness and the like. The OLEDs can be used to make thin display devices and flexible display devices and have gradually become the focus of research in the field of display technologies.

OLED display panels are accompanied by heating in the process of light emitting display, the carrier mobilities of OLED light emitting materials increase with an increase in temperature, and thus a leakage current between pixels also increases with the increase in temperature. FIG. 1 illustrates a schematic diagram of a correspondence between temperature and a color coordinate of an OLED sub-pixel. As shown in FIG. 1, the higher temperature, the larger the CIE y of the OLED sub-pixel, that is, the color purity deteriorates. Therefore, how to keep the display color purity to meet the display requirement in an OLED light emitting display process has become an urgent technical problem to be solved.

SUMMARY

The present disclosure provides a display panel, a control method thereof, and a display device to ensure that a color purity change in the light emitting display process of an OLED display panel meets a preset requirement so as to ensure normal display of the display panel.

In a first aspect, a control method of a display panel is provided in the embodiments of the present disclosure. The control method includes the steps described below.

A correspondence between temperature and voltage information of a first cathode of a first sub-pixel among a plurality of first sub-pixels is acquired.

A correspondence between temperature and information about a voltage difference between an auxiliary electrode and the first cathode is acquired.

Current temperature information of the display panel is acquired.

Voltage adjustment information of the first cathode and the auxiliary electrode is determined according to the current temperature information, the correspondence between temperature and the voltage information of the first cathode, and the correspondence between temperature and the information about the voltage difference between the auxiliary electrode and the first cathode so as to adjust the voltage difference between the first cathode and the auxiliary electrode so that a color purity change of the plurality of first sub-pixels meets a preset requirement.

The display panel includes a first driver chip, the plurality of first sub-pixels, the auxiliary electrode, a second driver chip and a plurality of second sub-pixels.

The first driver chip, the plurality of first sub-pixels and the auxiliary electrode are disposed in a display region, and each first sub-pixel among the plurality of first sub-pixels includes a first cathode and a first anode.

The second driver chip and a plurality of second sub-pixels are disposed in a temperature sensing region, the temperature sensing region is located on at least one side of the display region, each second sub-pixel among the plurality of second sub-pixels includes a second cathode, and the second cathode is electrically connected to the first cathode.

Optionally, the step of determining the voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode includes the steps described below.

Voltage adjustment information of the first cathode is determined according to the current temperature information and the correspondence between temperature and the voltage information of the first cathode so that brightness of each first sub-pixel is unchanged.

Voltage adjustment information of the auxiliary electrode is determined according to the current temperature information, the voltage adjustment information of the first cathode, and the correspondence between temperature and the information about the voltage difference between the auxiliary electrode and the first cathode.

Optionally, the voltage difference between the auxiliary electrode and the first cathode is V1 at a first temperature TI, and the voltage difference between the auxiliary electrode and the first cathode is V2 at a second temperature T2.

T1<T2 and V1<V2.

Optionally, the step of acquiring the correspondence between temperature and the information about the voltage difference between the auxiliary electrode and the first cathode includes the steps described below.

A first correspondence between temperature and a color coordinate is determined.

A second correspondence between the color coordinate and the information about the voltage difference between the auxiliary electrode and the first cathode is determined.

The correspondence between temperature and the information about the voltage difference between the auxiliary electrode and the first cathode is determined according to the first correspondence and the second correspondence.

Optionally, each first sub-pixel further includes a light emitting layer located between the first cathode and the first anode, and the light emitting layer includes a plurality of light emitting sub-layers stacked.

Each first sub-pixel includes a blue sub-pixel.

The first correspondence satisfies that $CIE = a1*T^2 + b1*T + c1$. CIE denotes the color coordinate, T denotes temperature, and a1, b1 and c1 are constants related to a material and a structure of the light emitting layer.

The second correspondence satisfies that $CIE = d1*V + e1$. CIE denotes the color coordinate, V denotes the voltage difference between the auxiliary electrode and the first cathode, and d1 and e1 are constants related to the material and the structure of the light emitting layer.

The correspondence between temperature and the information about the voltage difference between the auxiliary electrode and the first cathode satisfies that $V2 = V1 + (a1*$ $(T2^2-T1^2)+b1*(T2-T1))/d1$. V1 denotes a voltage difference between the auxiliary electrode and the first cathode at a first temperature T1, and V2 denotes a voltage difference between the auxiliary electrode and the first cathode at a second temperature T2.

Optionally, each first sub-pixel further includes a light emitting layer located between the first cathode and the first anode, and the light emitting layer includes a plurality of light emitting sub-layers stacked.

Each first sub-pixel includes a red sub-pixel and a green sub-pixel.

The first correspondence satisfies that $CIE=a2*T+b2$. CIE denotes the color coordinate, T denotes temperature, and a2 and b2 are constants related to a material and a structure of the light emitting layer.

The second correspondence satisfies that $CIE=c2*V+d2$. CIE denotes the color coordinate, V denotes the voltage difference between the auxiliary electrode and the first cathode, and c2 and d2 are constants related to the material and the structure of the light emitting layer.

The correspondence between temperature and the information about the voltage difference between the auxiliary electrode and the first cathode satisfies that $V2=V1+(a2*(T2-T1))/c2$. V1 denotes a voltage difference between the auxiliary electrode and the first cathode at a first temperature T1, and V2 denotes a voltage difference between the auxiliary electrode and the first cathode at a second temperature T2.

Optionally, the step of acquiring the correspondence between temperature and the voltage information of the first cathode includes the steps described below.

Brightness of each first sub-pixel is fixed and a voltage of the first anode is kept unchanged to acquire voltage information of the first cathode at different temperatures.

The preceding step is repeated to obtain the correspondence between temperature and the voltage information of the first cathode under different brightness of the first sub-pixel.

Optionally, the step of acquiring the current temperature information of the display panel includes the steps described below.

Current voltage information of the second cathode is acquired, where the current voltage information of the second cathode is the same as current voltage information of the first cathode.

The current temperature information of the display panel is determined according to the current voltage information of the second cathode and the correspondence between temperature and the voltage information of the first cathode.

In a second aspect, a display panel is further provided in the embodiments of the present disclosure. The display panel includes a first driver chip, a plurality of first sub-pixels, an auxiliary electrode, a second driver chip and a plurality of second sub-pixels.

The first driver chip, the plurality of first sub-pixels and the auxiliary electrode are disposed in a display region, and each first sub-pixel among the plurality of first sub-pixels includes a first cathode and a first anode.

The second driver chip and the plurality of second sub-pixels are disposed in a temperature sensing region, the temperature sensing region is located on at least one side of the display region, each second sub-pixel among the plurality of second sub-pixels includes a second cathode, and the second cathode is electrically connected to the first cathode.

The second driver chip is configured to acquire a correspondence between temperature and voltage information of the first cathode, acquire a correspondence between temperature and information about a voltage difference between the auxiliary electrode and the first cathode, acquire current temperature information of the display panel, determine voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode, and send the voltage adjustment information of the first cathode and the auxiliary electrode to the first driver chip.

The first driver chip is configured to receive the voltage adjustment information of the first cathode and the auxiliary electrode and adjust the voltage difference between the first cathode and the auxiliary electrode according to the voltage adjustment information of the first cathode and the auxiliary electrode so that a color purity change of the plurality of first sub-pixels meets a preset requirement.

In a third aspect, a display device is further provided in the embodiments of the present disclosure. The display device includes the display panel described in the second aspect.

According to the control method of the display panel provided in the embodiments of the present disclosure, the display panel includes the display region and the temperature sensing region located on at least one side of the display region. The plurality of first sub-pixels and the auxiliary electrode are included in the display region, and the first sub-pixel includes the first anode and the first cathode. The second sub-pixels are included in the temperature sensing region, the second sub-pixel includes the second cathode, and the second cathode is electrically connected to the first cathode. The voltage difference between the auxiliary electrode and the first cathode affects the color purity of a sub-pixel. Therefore, in the control method provided in the embodiments of the present disclosure, the correspondence between temperature and the voltage information of the first cathode, the correspondence between temperature and the information about the voltage difference between the auxiliary electrode and the first cathode and the current temperature information are separately acquired; then, the voltage adjustment information of the first cathode and the auxiliary electrode is determined according to the current temperature information, the correspondence between temperature and the voltage information of the first cathode, and the correspondence between temperature and the information about the voltage difference between the auxiliary electrode and the first cathode. The voltage difference between the first cathode and the auxiliary electrode is adjusted such that the color purity change caused by the temperature change is compensated for to ensure that the color purity change of the first sub-pixel meets the preset requirement, that the change of the display color purity is unaffected or less affected in the light emitting display process of the display panel, and that the display requirement is met.

DETAILED DESCRIPTION

Figure 1:
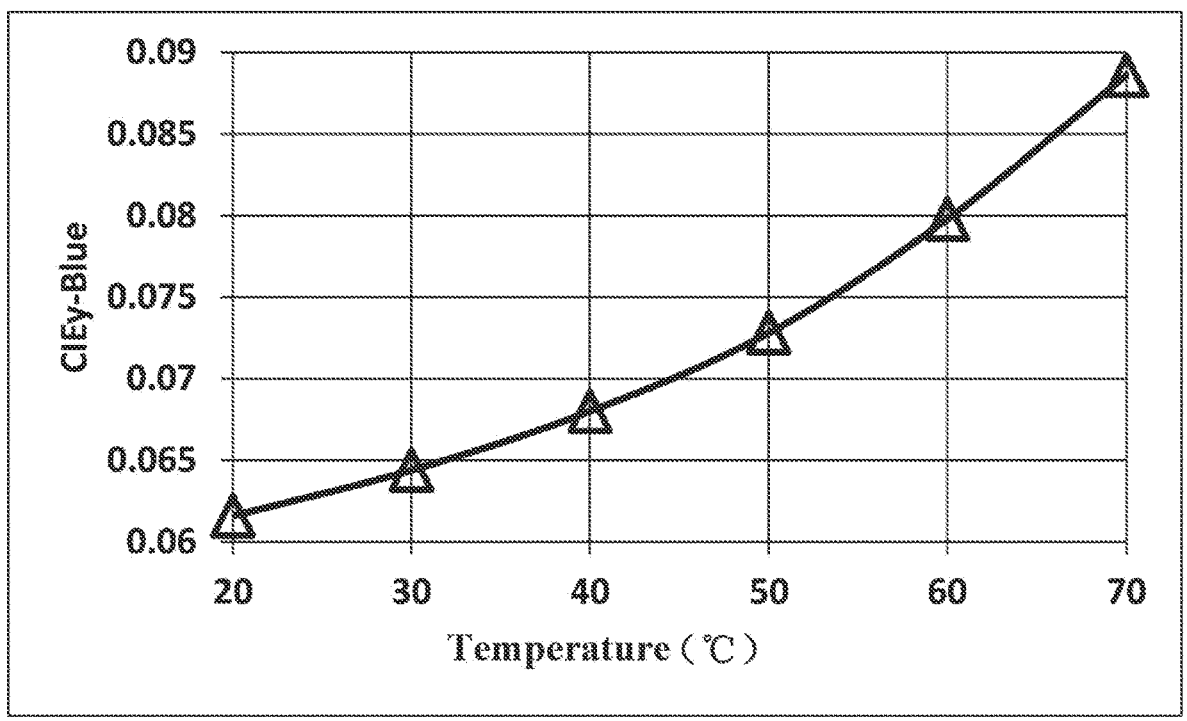
FIG. 1 illustrates a schematic diagram of a correspondence between temperature and a color coordinate of an OLED sub-pixel.

The present disclosure is further described below in detail in conjunction with drawings and embodiments. It is to be understood that the embodiments described herein are merely intended to explain the present disclosure and not to limit the present disclosure. Additionally, it is to be noted that for ease of description, merely part, not all, of the structures related to the present disclosure are illustrated in the drawings.

Figure 2:
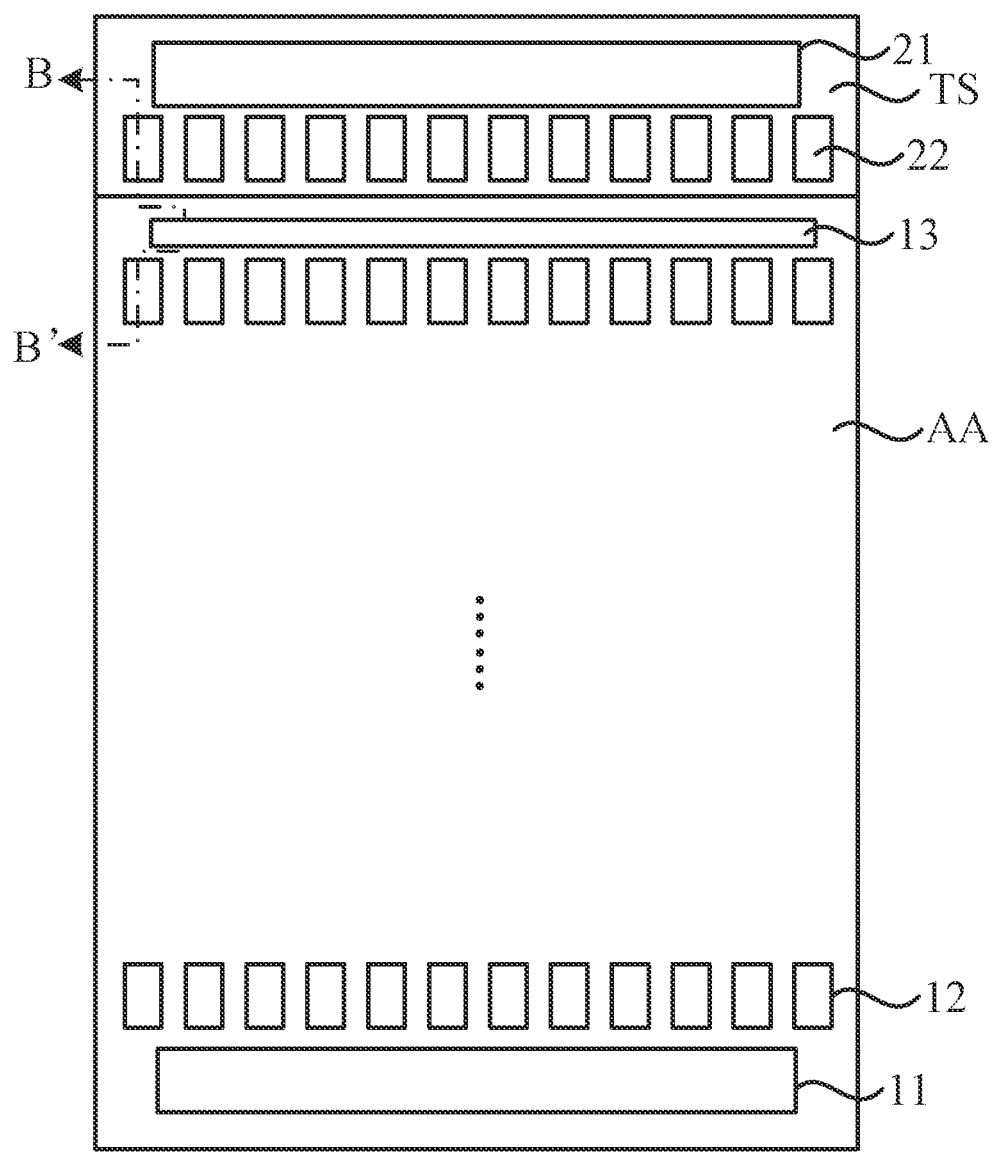
FIG. 2 illustrates a structure diagram of a display panel according to an embodiment of the present disclosure.
Figure 3:
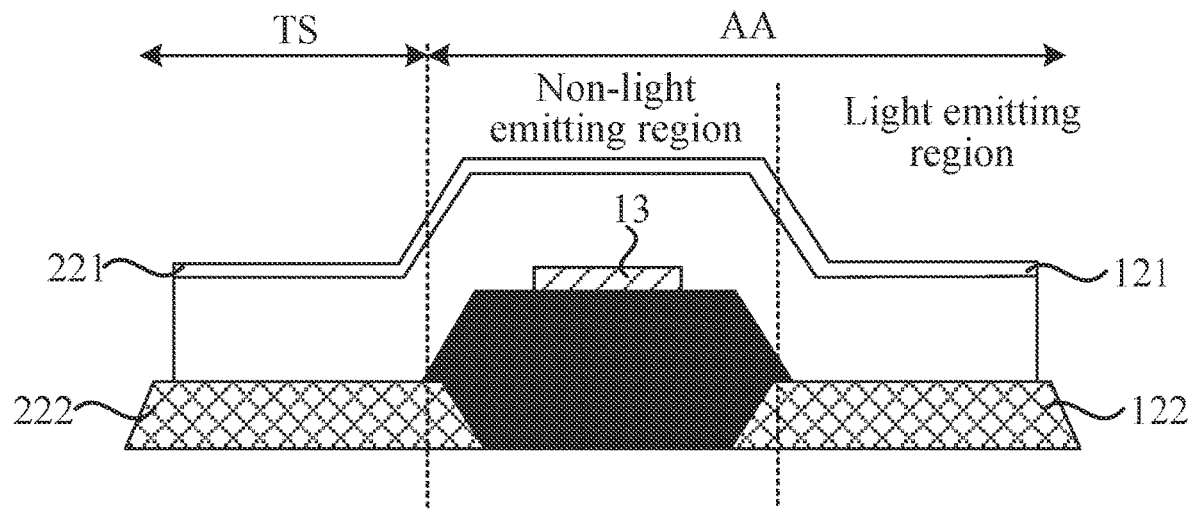
FIG. 3 illustrates a sectional view of the display panel of FIG. 2 taken along a section line B-B'.
Figure 4:
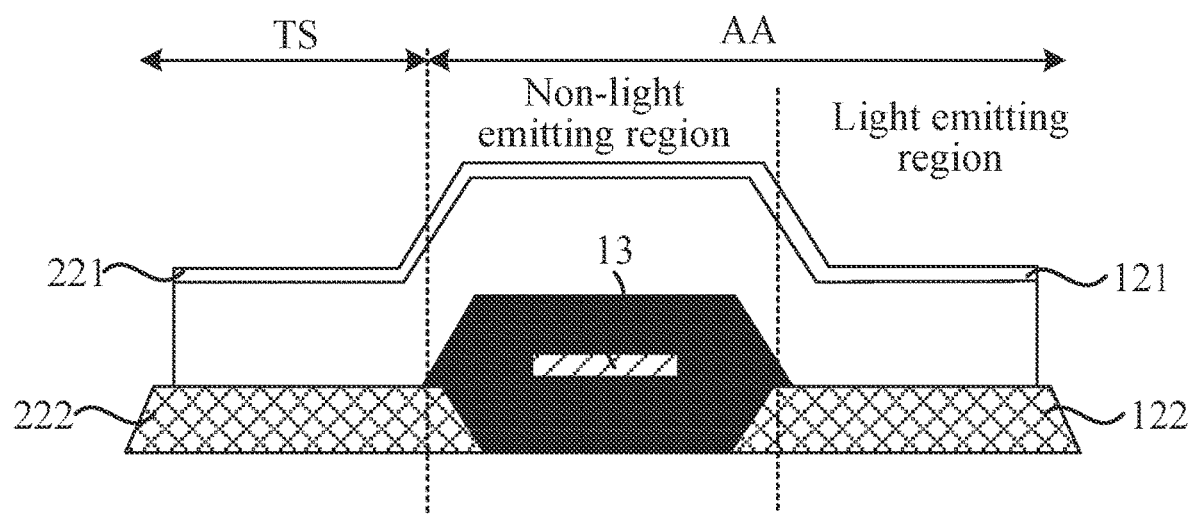
FIG. 4 illustrates another sectional view of the display panel of FIG. 2 taken along the section line B-B'.
Figure 5:
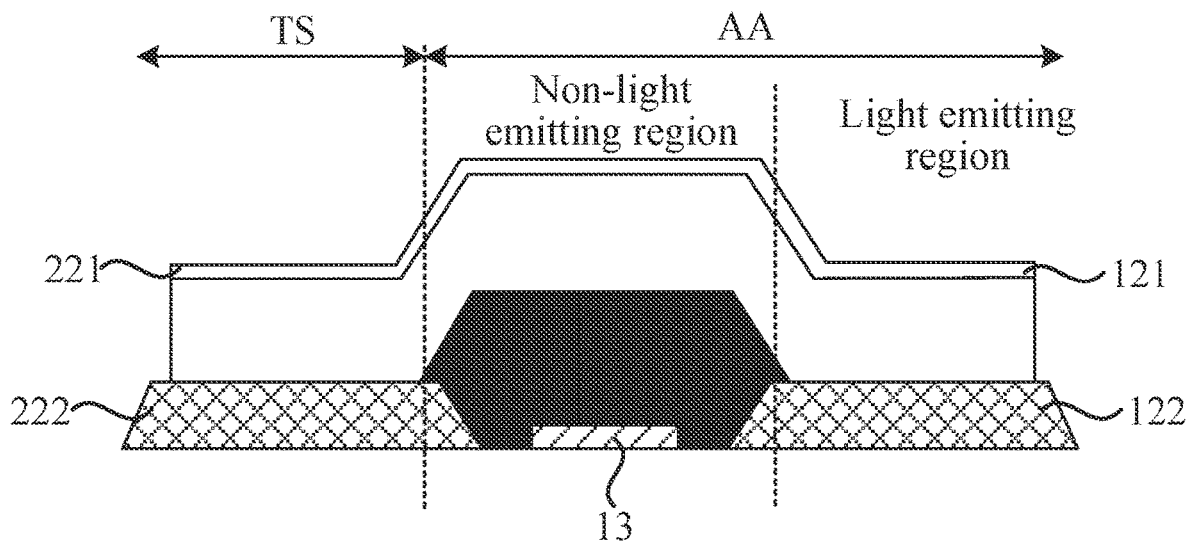
FIG. 5 illustrates another sectional view of the display panel of FIG. 2 taken along the section line B-B'.

FIG. 2 illustrates a structure diagram of a display panel according to an embodiment of the present disclosure; FIG. 3 illustrates a sectional view of the display panel of FIG. 2 taken along a section line B-B'; FIG. 4 illustrates another sectional view of the display panel of FIG. 2 taken along the section line B-B'; and FIG. 5 illustrates another sectional view of the display panel of FIG. 2 taken along the section line B-B'. With reference to FIGS. 2 to 5, the display panel includes a display region AA and a temperature sensing region TS located on at least one side of the display region AA. A first driver chip 11, a plurality of first sub-pixels 12 and an auxiliary electrode 13 are included in the display region AA, and the first sub-pixel 12 includes a first cathode 121 and a first anode 122. A second driver chip 21 and a plurality of second sub-pixels 22 are included in the temperature sensing region TS, each of the second sub-pixels 22 includes a second cathode 221, and the second cathode 221 is electrically connected to the first cathode 121.

With reference to FIGS. 2 and 5, the display panel includes the display region AA and the temperature sensing region TS, and the display region AA further includes a light emitting region and a non-light emitting region. The first driver chip 11, the first sub-pixels 12 and the auxiliary electrode 13 are disposed in the display region AA. Each of the first sub-pixels 12 includes the first cathode 121 and the first anode 122. The first sub-pixels 12 are disposed in the light emitting region. The first driver chip 11 and the auxiliary electrode 13 are disposed in the non-light emitting region. The first driver chip 11 is used for providing a display drive signal for the first sub-pixels 12. A voltage is applied on the auxiliary electrode 13. A potential difference is formed between the voltage on the auxiliary electrode 13 and the voltage on the first anode 122 so that the leakage current between adjacent first sub-pixels 12 can be reduced, crosstalk can be suppressed, and image quality can be improved.

Further, the second driver chip 21 and the plurality of second sub-pixels 22 are included in the temperature sensing region TS, and each of the second sub-pixels 22 includes the second cathode 221 and a second anode 222. The second cathode 221 is electrically connected to the first cathode 121, for example, the second cathode 221 and the first cathode 121 may be the same cathode electrode. Moreover, the second driver chip 21 is communicatively connected to the first driver chip 11.

Figure 6:
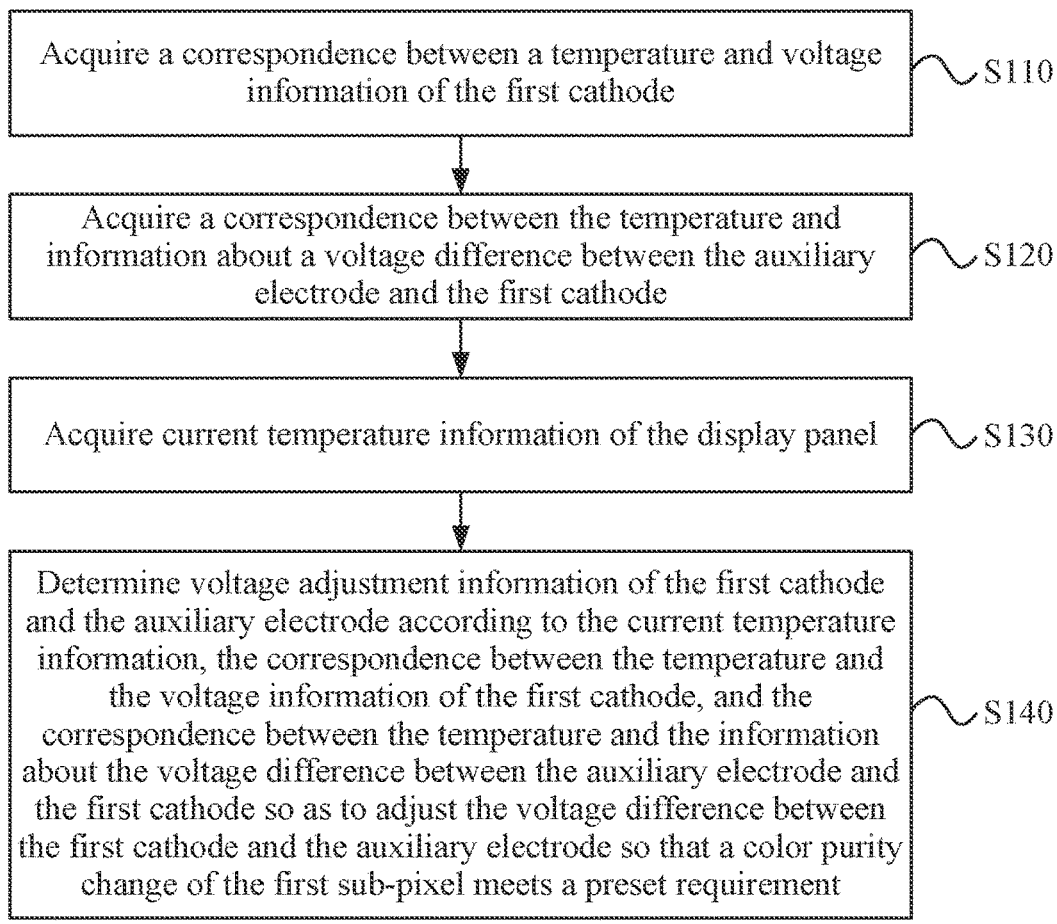
FIG. 6 illustrates a flowchart of a control method of a display panel according to an embodiment of the present disclosure.

Based on the structure of the preceding display panel, a control method of a display panel is provided in the embodiments of the present disclosure. FIG. 6 illustrates a flowchart of a control method of a display panel according to an embodiment of the present disclosure. As shown in FIG. 6, the control method of the display panel provided in the embodiment of the present disclosure includes the steps described below.

S110: A correspondence between temperature and voltage information of the first cathode is acquired.

Figure 7:
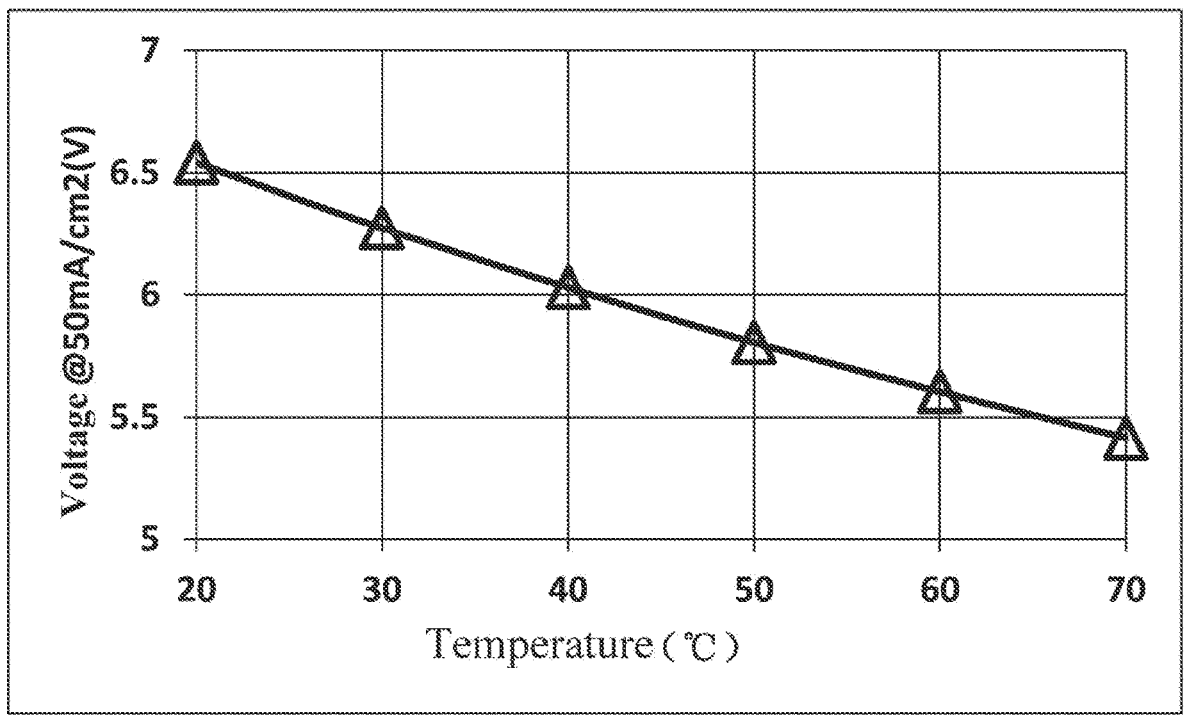
FIG. 7 illustrates a schematic diagram of a correspondence between temperature and a voltage difference between a first cathode and a first anode according to an embodiment of the present disclosure.

FIG. 7 illustrates a schematic diagram of a correspondence between temperature and a voltage difference between a first cathode and a first anode according to an embodiment of the present disclosure. Optionally, FIG. 7 illustrates a schematic diagram of a correspondence between temperature and a voltage difference between a first cathode and a first anode when the current density of the first sub-pixel is 50 mA/cm$^2$. As can be seen from FIG. 7, the voltage difference between the first cathode and the first anode decreases as temperature increases, and in the case where the first sub-pixel operates at a fixed current density and the voltage of the first anode is fixed, the voltage information of the first cathode varies with temperature. In order to ensure that the brightness of the first sub-pixel remains unchanged, it is necessary to know the correspondence between the voltage information of the first cathode and temperature. When temperature changes, the brightness of the first sub-pixel can be ensured to remain unchanged through adjustment of the voltage of the first cathode.

S120: A correspondence between temperature and information about a voltage difference between the auxiliary electrode and the first cathode is acquired.

Figure 8:
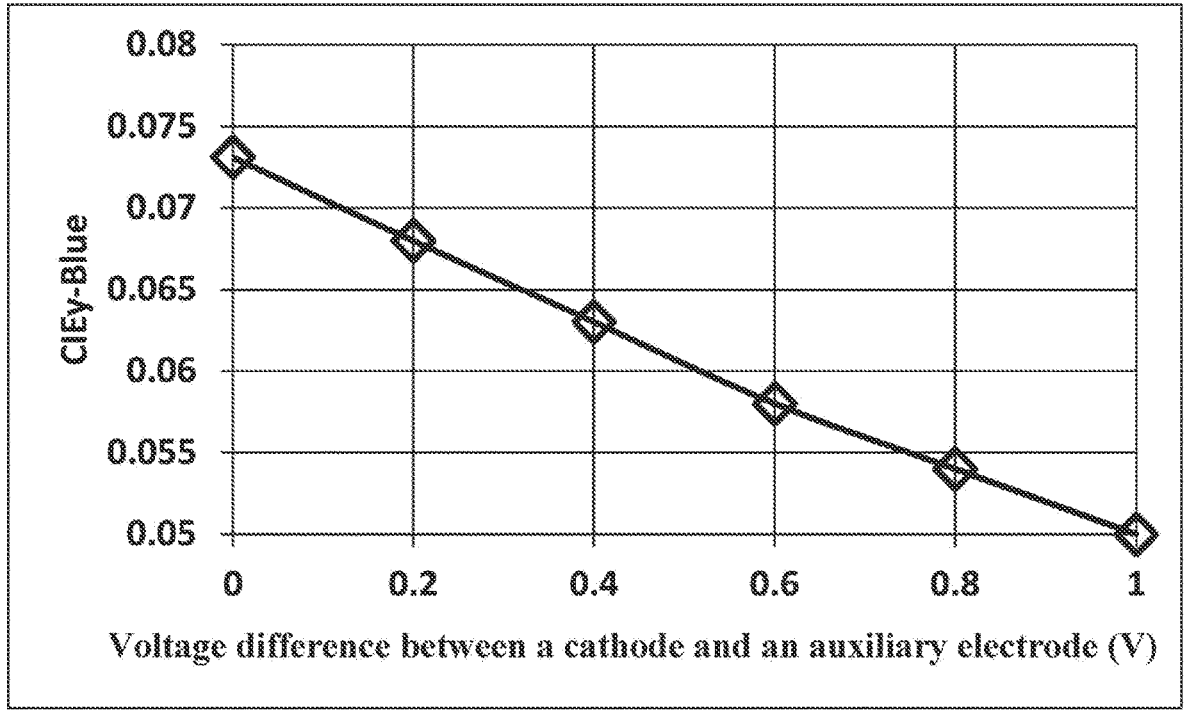
FIG. 8 illustrates a schematic diagram of a correspondence between a color coordinate of an OLED sub-pixel and a voltage difference between an auxiliary electrode and a first cathode according to an embodiment of the present disclosure.

FIG. 8 illustrates a schematic diagram of a correspondence between a color coordinate of an OLED sub-pixel and a voltage difference between an auxiliary electrode and a first cathode according to an embodiment of the present disclosure. As shown in FIG. 8, the greater the voltage difference between the first cathode and the auxiliary electrode at a fixed temperature, the higher the color purity of the OLED sub-pixel. Therefore, for the color purity deterioration caused by temperature change, the color purity can be kept to meet the preset requirement through a change in the voltage difference between the first cathode and the auxiliary electrode.

In an embodiment, the voltage difference between the auxiliary electrode and the first cathode is V1 at a first temperature TI, and the voltage difference between the auxiliary electrode and the first cathode is V2 at a second temperature T2. T1<T2 and V1<V2. That is, when temperature increases, the voltage difference between the auxiliary electrode and the first cathode can be increased, and thus high color purity can be achieved by the larger voltage difference between the auxiliary electrode and the first cathode, compensating for the decrease in color purity caused by the increase in temperature. Therefore, it is necessary to know the correspondence between temperature and the information about the voltage difference between the auxiliary electrode and the first cathode in order to ensure that the color purity of the OLED sub-pixel can be improved through adjustment of information about the voltage difference between the auxiliary electrode and the first cathode to compensate for the decrease in the color purity caused by temperature change. In this manner, when temperature change, the color purity of the first sub-pixel can be ensured to meet the preset requirement through adjustment of the information about the voltage difference between the auxiliary electrode and the first cathode.

S130: Current temperature information of the display panel is acquired.

S140: Voltage adjustment information of the first cathode and the auxiliary electrode is determined according to the current temperature information, the correspondence between temperature and the voltage information of the first cathode, and the correspondence between temperature and the information about the voltage difference between the auxiliary electrode and the first cathode so as to adjust the voltage difference between the first cathode and the auxiliary electrode so that a color purity change of the first sub-pixel meets a preset requirement.

Exemplarily, after the current temperature information is acquired, the voltage of the first cathode is adjusted according to the correspondence between the voltage information of the first cathode and temperature when the voltage of the first anode is unchanged in order to ensure that the current density (brightness) of the first sub-pixel is unchanged. Further, after the current temperature information is acquired, the information about the voltage difference between the auxiliary electrode and the first cathode can be further determined according to the correspondence between temperature and the information about the voltage difference between the auxiliary electrode and the first cathode. The voltage difference between the first cathode and the auxiliary electrode is adjusted so that the color purity change of the first sub-pixel meets the preset requirement.

Figure 9:
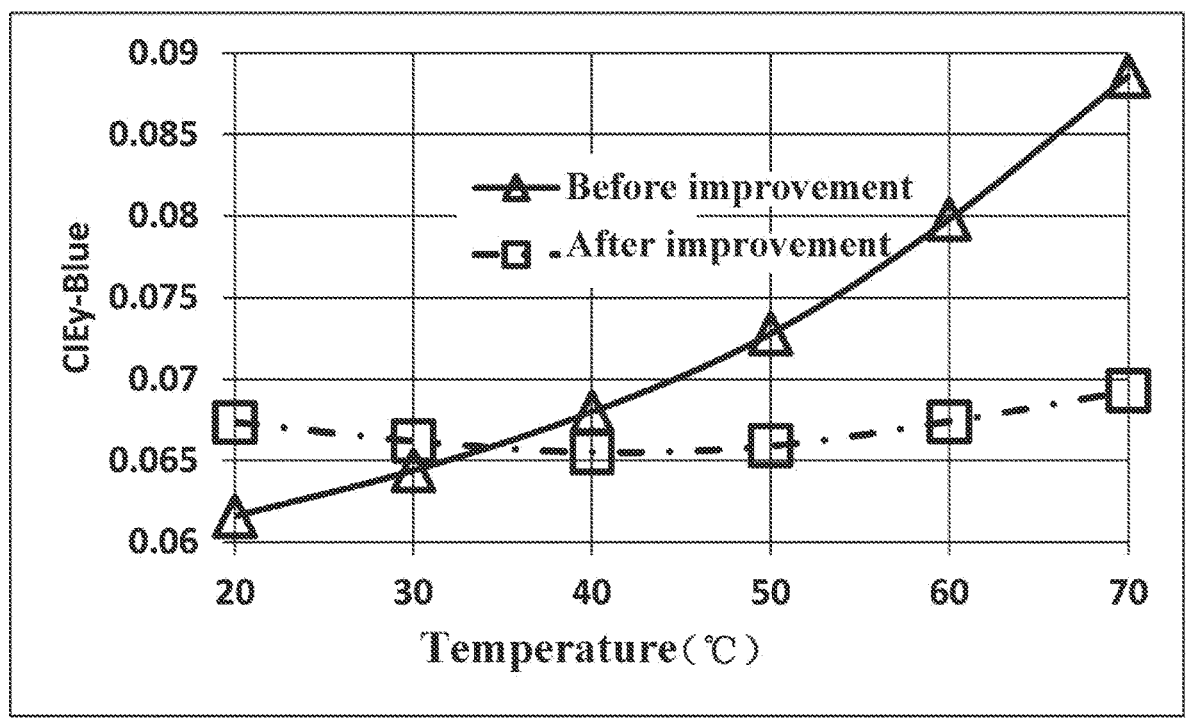
FIG. 9 illustrates a schematic diagram of a correspondence between temperature and a color coordinate of an OLED sub-pixel in a technical solution according to an embodiment of the present disclosure and a correspondence between temperature and a color coordinate of an OLED sub-pixel in a technical solution in the existing art.

In an embodiment, FIG. 9 illustrates a schematic diagram of a correspondence between temperature and a color coordinate of an OLED sub-pixel in a technical solution according to an embodiment of the present disclosure and a correspondence between temperature and a color coordinate of an OLED sub-pixel in a technical solution in the existing art. The curve before improvement represents the curve illustrating the correspondence between temperature and the color coordinate of the OLED sub-pixel in the technical solution in the existing art. The curve after improvement represents the curve illustrating the correspondence between temperature and the color coordinate of the OLED sub-pixel in the technical solution according to the embodiment of the present disclosure. As can be known by comparing the curve before improvement with the curve after improvement, in the technical solution according to the embodiment of the present disclosure, the value of color coordinate is basically unchanged when temperature changes. For example, the amount of change in CIEy, ΔCIEy, of blue light within the temperature change of 20° C. to 70° C. before improvement is 0.03, and ΔCIEy of blue light within the temperature change of 20° C. to 70° C. after improvement is 0.005. According to the technical solution provided in the embodiment of the present disclosure, the change in the color coordinate caused by temperature can be obviously supplemented through adjustment of the potential difference between the auxiliary electrode and the first cathode, ensuring that the color purity change meets the preset requirement.

In summary, in the control method of the display panel provided in the embodiment of the present disclosure, the correspondence between temperature and the voltage information of the first cathode, the correspondence between temperature and the information about the voltage difference between the auxiliary electrode and the first cathode and the current temperature information are separately acquired; then, the voltage adjustment information of the first cathode and the auxiliary electrode is determined according to the current temperature information, the correspondence between temperature and the voltage information of the first cathode, and the correspondence between temperature and the information about the voltage difference between the auxiliary electrode and the first cathode. The voltage difference between the first cathode and the auxiliary electrode is adjusted such that the color purity change caused by the temperature change is compensated for to ensure that the color purity change of the first sub-pixel meets the preset requirement, that the display brightness is unchanged and the change of the display color purity is unaffected or less affected in the normal light emitting display process of the display panel, and that the display requirement is met.

Figure 10:
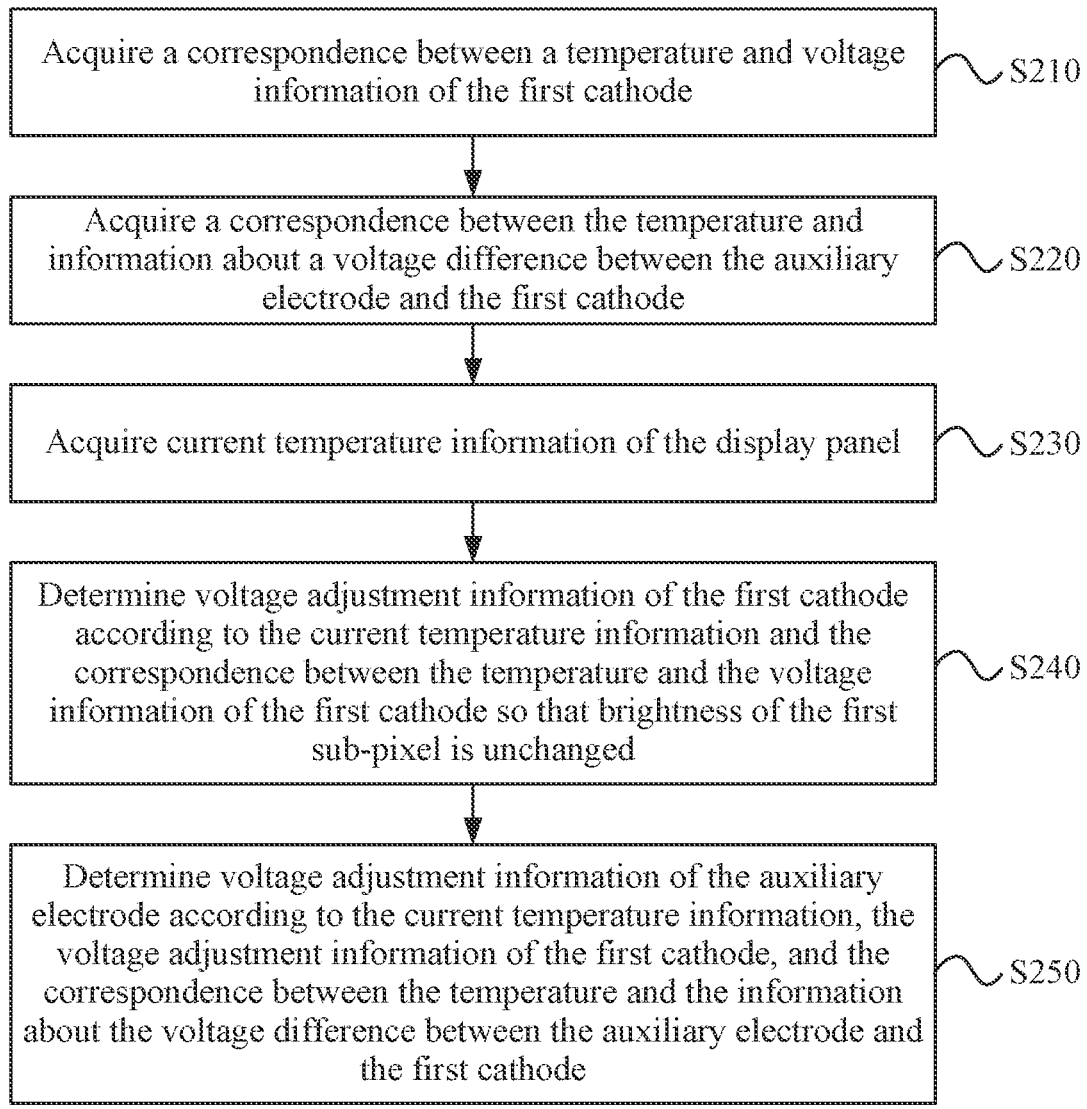
FIG. 10 illustrates a flowchart of another control method of a display panel according to an embodiment of the present disclosure.

On the basis of the preceding embodiment, FIG. 10 illustrates a flowchart of another control method of a display panel according to an embodiment of the present disclosure. The control method provided in FIG. 10 describes in detail how to determine the voltage adjustment information of the first cathode and the auxiliary electrode according to the current temperature information, the correspondence between the voltage information of the first cathode and temperature, and the correspondence between temperature and the information about the voltage difference between the auxiliary electrode and the first cathode.

In an embodiment, the control method of the display panel shown in FIG. 10 includes the steps described below.

S210: A correspondence between temperature and voltage information of the first cathode is acquired.

S220: A correspondence between temperature and information about a voltage difference between the auxiliary electrode and the first cathode is acquired.

S230: Current temperature information of the display panel is acquired.

S240: Voltage adjustment information of the first cathode is determined according to the current temperature information and the correspondence between temperature and the voltage information of the first cathode so that brightness of the first sub-pixel is unchanged.

Exemplarily, the current voltage information of the first cathode corresponding to the current temperature information can be known and how to adjust the voltage of the first cathode can be determined according to the current temperature information and the correspondence between the voltage information of the first cathode and temperature so as to ensure that the brightness (current density) of the first sub-pixel is unchanged in the case where the voltage information of the first anode is unchanged.

S250: Voltage adjustment information of the auxiliary electrode is determined according to the current temperature information, the voltage adjustment information of the first cathode, and the correspondence between temperature and the information about the voltage difference between the auxiliary electrode and the first cathode.

Exemplarily, the information about the voltage difference between the auxiliary electrode and the first cathode with the current temperature information can be determined according to the current temperature information and the correspondence between temperature and the information about the voltage difference between the auxiliary electrode and the first cathode. The voltage adjustment information can be known according to S240. Therefore, the adjustment information of the auxiliary electrode can be determined according to the information about the voltage difference between the auxiliary electrode and the first cathode with the current temperature information and the voltage adjustment information of the first cathode, and the voltage of the auxiliary electrode can be adjusted according to the voltage adjustment information of the auxiliary electrode. Therefore, the color purity of the first sub-pixel is ensured to meet the preset requirement and, meanwhile, the brightness of the first sub-pixel is ensured to be unchanged through separate adjustment of the voltage of the first cathode and the voltage of the auxiliary electrode when temperature changes. Thus, the display effect is ensured to be good.

The preceding embodiment describes in detail how to determine the voltage adjustment information of the first cathode and the auxiliary electrode according to the current temperature information, the correspondence between the voltage information of the first cathode and temperature, and the correspondence between temperature and the information about the voltage difference between the auxiliary electrode and the first cathode. The color purity of the first sub-pixel is ensured to meet the preset requirement and, meanwhile, the brightness of the first sub-pixel is ensured to be unchanged through separate determination of the voltage adjustment information of the first cathode and the voltage adjustment information of the auxiliary electrode. Thus, the display effect is ensured to be good.

Figure 11:
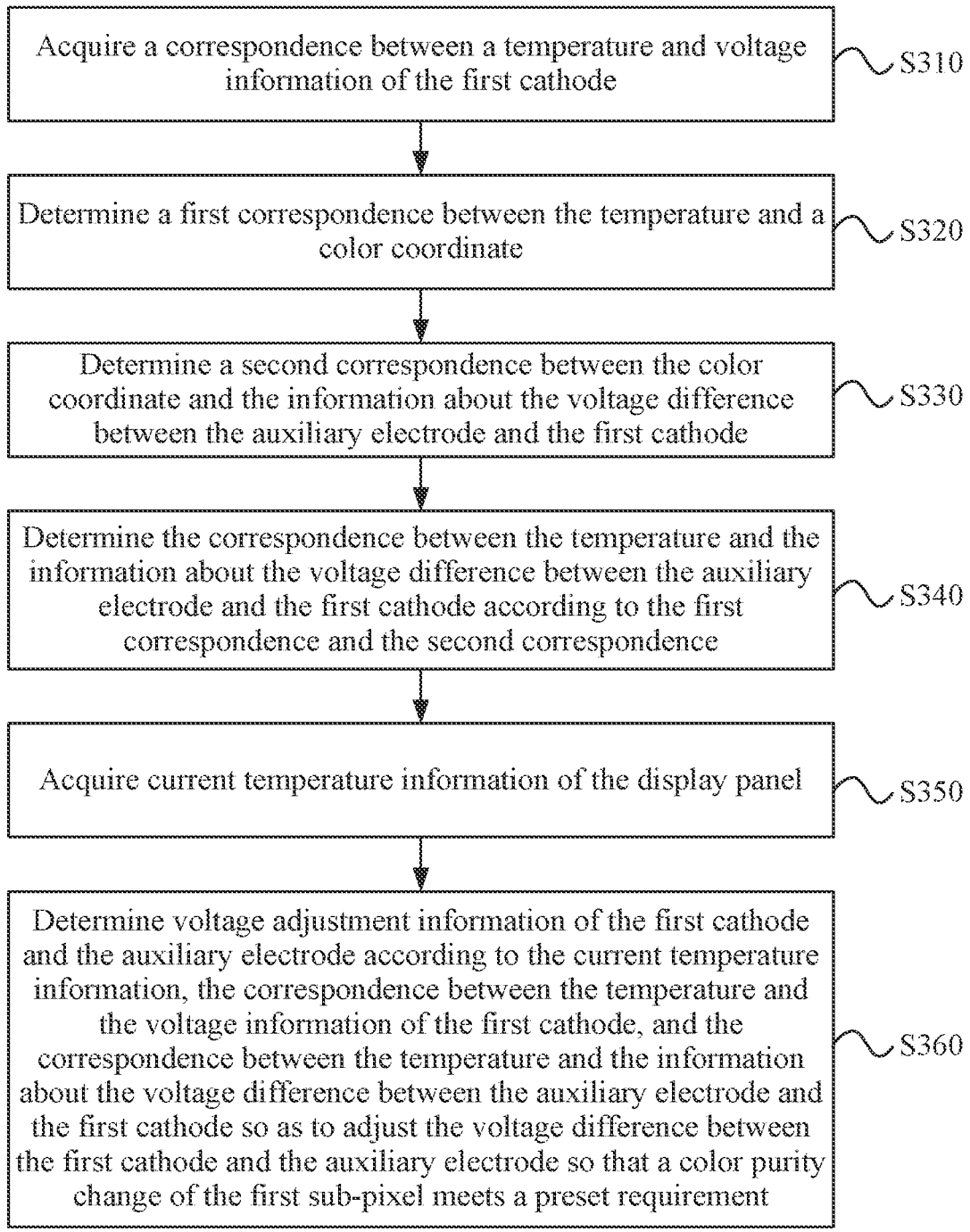
FIG. 11 illustrates a flowchart of another control method of a display panel according to an embodiment of the present disclosure.

On the basis of the preceding embodiment, FIG. 11 illustrates a flowchart of another control method of a display panel according to an embodiment of the present disclosure. The control method provided in FIG. 11 describes in detail how to acquire the correspondence between temperature and the information about the voltage difference between the auxiliary electrode and the first cathode on the basis of the preceding embodiment.

In an embodiment, the control method of the display panel shown in FIG. 11 includes the steps described below.

S310: A correspondence between temperature and voltage information of the first cathode is acquired.

S320: A first correspondence between temperature and a color coordinate is determined.

S330: A second correspondence between the color coordinate and the information about the voltage difference between the auxiliary electrode and the first cathode is determined.

S340: The correspondence between temperature and the information about the voltage difference between the auxiliary electrode and the first cathode is determined according to the first correspondence and the second correspondence.

Exemplarily, for a determined OLED sub-pixel, a determined first correspondence exists between temperature and the color coordinate of such determined OLED sub-pixel, a determined second correspondence exists between the information about the voltage difference between the auxiliary electrode and the first cathode and the color coordinate of such determined OLED sub-pixel, and the first correspondence and the second correspondence are related to the light emitting color of the OLED sub-pixel and the specific structure of the light emitting layer.

Figure 12:
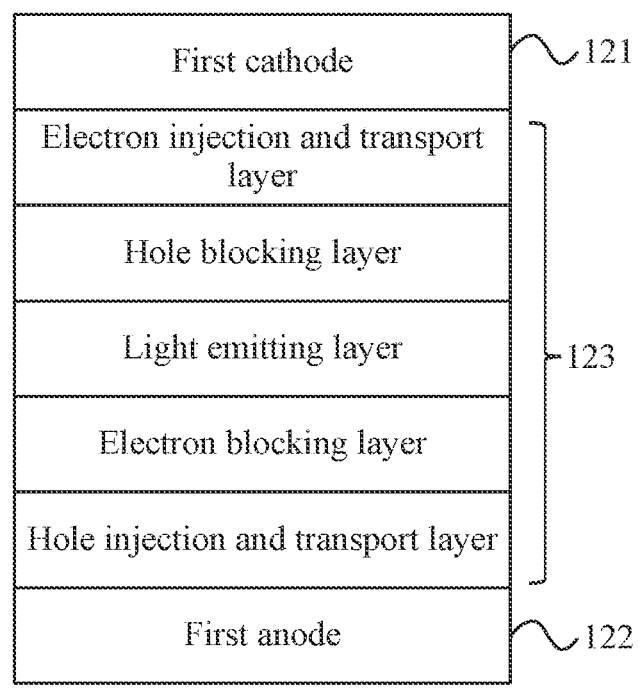
FIG. 12 is a structure diagram of a first sub-pixel according to an embodiment of the present disclosure.
Figure 13:
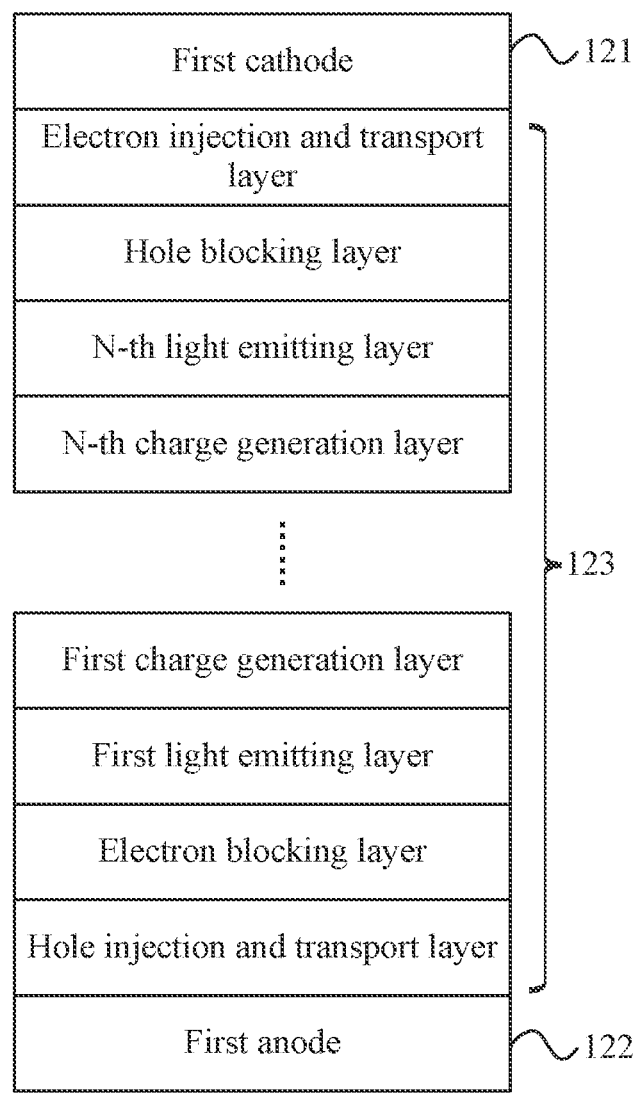
FIG. 13 is a structure diagram of another first sub-pixel according to an embodiment of the present disclosure.

In an embodiment, FIG. 12 is a structure diagram of a first sub-pixel according to an embodiment of the present disclosure. FIG. 13 is a structure diagram of another first sub-pixel according to an embodiment of the present disclosure. With reference to FIGS. 12 and 13, the first sub-pixel 12 further includes a light emitting layer 123 located between the first cathode 121 and the first anode 122, and the light emitting layer includes a plurality of light emitting sub-layers stacked. A light emitting layer 123 including a single stack light emitting layer is used as an example for illustration in FIG. 12, and a light emitting layer 123 including multiple stacked light emitting layers is as an example for illustration in FIG. 13. As shown in FIG. 12, the light emitting layer 123 including a single stack light emitting layer may include, for example, a hole injection and transport layer, an electron blocking layer, a light emitting layer, a hole blocking layer, an electron transport and injection layer which are stacked. As shown in FIG. 13, the light emitting layer 123 including multiple stacked light emitting layers may include, for example, a hole injection and transport layer, an electron blocking layer, a first light emitting layer, a first charge generation layer, . . . , an N-th charge generation layer, an N-th light emitting layer, a hole blocking layer, and an electron transport and injection layer which are stacked. Both of the first correspondence and the second correspondence vary with the light emitting colors of OLED sub-pixels. For OLED sub-pixels having the same light emitting color, the first correspondences are different and the second correspondences are different when the film structures, film thicknesses, film materials and doping concentrations of the light emitting layers are different.

The first correspondence and the second correspondence are described in detail below in two specific implementations.

Firstly, the case where the first sub-pixel includes a blue sub-pixel is used as an example for illustration.

The first correspondence satisfies that $CIE=a1*T^2+b1*T+c1$. CIE denotes the color coordinate, T denotes temperature, and a1, b1 and c1 are constants related to a material and a structure of the light emitting layer. Here, the structure includes a film structure, a film thickness and the like, and the material may include the type of the material, the doping concentration and the like.

The second correspondence satisfies that $CIE=d1*V+e1$. CIE denotes the color coordinate, V denotes the voltage difference between the auxiliary electrode and the first cathode, and d1 and e1 are constants related to the material and the structure of the light emitting layer.

The correspondence between temperature and the information about the voltage difference between the auxiliary electrode and the first cathode satisfies that $V2=V1+(a1*(T2^2-T1^2)+b1*(T2-T1))/d1$. V1 denotes a voltage difference between the auxiliary electrode and the first cathode at a first temperature T1, and V2 denotes a voltage difference between the auxiliary electrode and the first cathode at a second temperature T2.

The same operation is repeated at other temperatures, T3 to Tn, so that the voltage differences between the auxiliary electrode and the first cathode at different temperatures can be obtained. Then, the correspondence between temperature and the information about the voltage difference between the auxiliary electrode and the first cathode is written into the second driver chip. Then, the change in a color coordinate caused by temperature change can be compensated for through adjustment of the voltage difference between the auxiliary electrode and the first cathode, so as to ensure that the display color purity meets the preset requirement.

Next, the case where the first sub-pixel includes a red sub-pixel and a green sub-pixel is used as an example for illustration.

The first correspondence satisfies that CIE=a2*T+b2. CIE denotes the color coordinate, T denotes temperature, and a2 and b2 are constants related to a material and a structure of the light emitting layer. Here, the structure includes a film structure, a film thickness and the like, and the material may include the type of the material, the doping concentration and the like.

The second correspondence satisfies that CIE=c2*V+d2. CIE denotes the color coordinate, V denotes the voltage difference between the auxiliary electrode and the first cathode, and c2 and d2 are constants related to the material and the structure of the light emitting layer.

The correspondence between temperature and the information about the voltage difference between the auxiliary electrode and the first cathode satisfies that V2=V1+(a2*(T2−T1))/c2. V1 denotes a voltage difference between the auxiliary electrode and the first cathode at a first temperature T1, and V2 denotes a voltage difference between the auxiliary electrode and the first cathode at a second temperature T2.

The same operation is repeated at other temperatures, T3 to Tn, so that the voltage differences between the auxiliary electrode and the first cathode at different temperatures can be obtained. Then, the correspondence between temperature and the information about the voltage difference between the auxiliary electrode and the first cathode is written into the second driver chip. Then, the change in a color coordinate caused by temperature change can be compensated for through adjustment of the voltage difference between the auxiliary electrode and the first cathode, so as to ensure that the display color purity meets the preset requirement.

S350: Current temperature information of the display panel is acquired.

S360: Voltage adjustment information of the first cathode and the auxiliary electrode is determined according to the current temperature information, the correspondence between temperature and the voltage information of the first cathode, and the correspondence between temperature and the information about the voltage difference between the auxiliary electrode and the first cathode so as to adjust the voltage difference between the first cathode and the auxiliary electrode so that a color purity change of the first sub-pixel meets a preset requirement.

How to acquire the correspondence between temperature and the information about the voltage difference between the auxiliary electrode and the first cathode is described in detail and in two feasible implementations. In this manner, the change in a color coordinate caused by temperature change can be ensured to be compensated for through adjustment of the voltage difference between the auxiliary electrode and the first cathode, so as to ensure that the display color purity meets the preset requirement.

On the basis of the preceding embodiment, the step of acquiring the correspondence between temperature and the voltage information of the first cathode may include the steps described below.

Brightness of the first sub-pixel is fixed and a voltage of the first anode is kept unchanged to acquire voltage information of the first cathode at different temperatures.

The preceding step is repeated to obtain the correspondence between temperature and the voltage information of the first cathode under different brightness of the first sub-pixel.

With further reference to FIG. 7, it can be known that the voltage difference between the first cathode and the first anode decreases as temperature increases. The voltage signals of the first cathode at different temperatures are obtained in the case where the brightness of the first sub-pixel is fixed (that is, the first sub-pixel is kept to operate at a fixed current density) and the voltage of the first anode is unchanged. The brightness of the first sub-pixel is adjusted (that is, the first sub-pixel is adjusted to operate at a fixed current density). The preceding step continues to be repeated so as to obtain the correspondence between the voltage information of the first cathode and temperature under different brightness of the first sub-pixel. The correspondence can be written into the second driver chip. Subsequently, when temperature changes, the brightness of the first sub-pixel is ensured to remain unchanged through adjustment of the voltage of the first cathode in time.

On the basis of the preceding embodiment, the step of acquiring the current temperature information of the display panel may include the steps described below.

Current voltage information of the second cathode is acquired, where the current voltage information of the second cathode is the same as current voltage information of the first cathode.

The current temperature information of the display panel is determined according to the current voltage information of the second cathode and the correspondence between temperature and the voltage information of the first cathode.

Exemplarily, since the second cathode is electrically connected to the first cathode, for example, the second cathode and the first cathode share the same cathode electrode, the voltage information of the second cathode is the same as the voltage information of the first cathode. As described above, the correspondence between the voltage information of the first cathode and temperature is known. Therefore, the current temperature information of the display panel can be known after the current voltage information of the second cathode is acquired and the current voltage signal of the second cathode is put into the correspondence between the voltage information of the first cathode and temperature. In this manner, the temperature information can be easily acquired.

Based on the same concept, a display panel is further provided in the embodiments of the present disclosure. As shown in FIG. 2, the display panel includes a display region AA and a temperature sensing region TS located on at least one side of the display region AA. A first driver chip 11, a plurality of first sub-pixels 12 and an auxiliary electrode 13 are included in the display region AA, and each of the first sub-pixels 12 includes a first cathode 121 and a first anode 122. A second driver chip 21 and a plurality of second sub-pixels 22 are included in the temperature sensing region TS, each of the second sub-pixels 22 includes a second cathode 221, and the second cathode 221 is electrically connected to the first cathode 121. The second driver chip 21 is configured to acquire a correspondence between temperature and voltage information of the first cathode, acquire a correspondence between temperature and information about a voltage difference between the auxiliary electrode and the first cathode, acquire current temperature information of the display panel, determine voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode, and send the voltage adjustment information of the first cathode and the auxiliary electrode to the first driver chip 11. The first driver chip 11 is configured to receive the voltage adjustment information of the first cathode and the auxiliary electrode and adjust the voltage difference between the first cathode and the auxiliary electrode according to the voltage adjustment information of the first cathode and the auxiliary electrode so that a color purity change of the first sub-pixel meets a preset requirement.

Exemplarily, the display panel provided in the embodiments of the present disclosure is applicable to the preceding control method. The correspondence between the voltage information of the first cathode and temperature and the correspondence between temperature and the information about the voltage difference between the auxiliary electrode and the first cathode are separately written into the second driver chip. After the current temperature of the display panel is determined, the voltage adjustment information of the first cathode and the auxiliary electrode is determined according to the current temperature information, the correspondence between temperature and the voltage information of the first cathode, and the correspondence between temperature and the information about the voltage difference between the auxiliary electrode and the first cathode. The current temperature of the display panel is determined according to the current voltage information of the second cathode and the correspondence between temperature and the voltage information of the first cathode. The second driver chip 21 is communicatively connected to the first driver chip 11. Therefore, the second driver chip 21 can send the voltage adjustment information of the first cathode and the auxiliary electrode to the first driver chip 11. When temperature changes, the first driver chip 11 can adjust the voltage difference between the first cathode and the auxiliary electrode according to the voltage adjustment information of the first cathode and the auxiliary electrode so that the color purity change of the first sub-pixel meets the preset requirement, and the display effect is ensured to be good.

Figure 14:
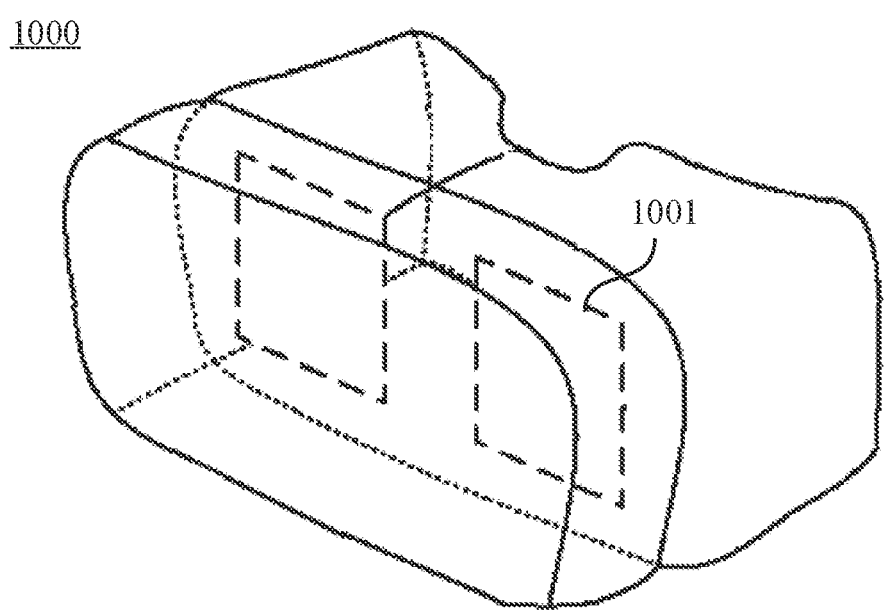
FIG. 14 illustrates a structural view of a display device according to an embodiment of the present disclosure.

Based on the same concept, a display device is further provided in the embodiments of the present disclosure. FIG. 14 illustrates a structural view of a display device according to an embodiment of the present disclosure. As shown in FIG. 14, a display device 1000 includes the display panel 1001 in the preceding embodiment. Therefore, the display device 1000 provided in the embodiment of the present disclosure also has the beneficial effects described in the preceding embodiment, and details are not repeated here. Exemplarily, the display device 1000 may be an electronic display device, such as an augmented reality (AR) display device, a virtual reality (VR) display device, a mobile phone, a computer, or a television, which is not limited in the embodiment of the present disclosure.

It is to be noted that the above are merely preferred embodiments of the present disclosure and the principles used therein. It is to be understood by those skilled in the art that the present disclosure is not limited to the preceding embodiments. Those skilled in the art can make various apparent modifications, adaptations and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A control method of a display panel, comprising:
    acquiring a correspondence between temperature and voltage information of a first cathode of a first sub-pixel among a plurality of first sub-pixels;
    acquiring a correspondence between temperature and information about a voltage difference between an auxiliary electrode and the first cathode;
    acquiring current temperature information of the display panel; and
    determining voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode so as to adjust the voltage difference between the first cathode and the auxiliary electrode so that a color purity change of the plurality of first sub-pixels meets a preset requirement;
    wherein the display panel comprises:
        a first driver chip, the plurality of first sub-pixels and the auxiliary electrode which are disposed in a display region, wherein each first sub-pixel comprises the first cathode and a first anode; and
        a plurality of second sub-pixels and a second driver chip which are disposed in a temperature sensing region, wherein the temperature sensing region is located on at least one side of the display region, each second sub-pixel comprises a second cathode, and the second cathode is electrically connected to the first cathode;
    wherein acquiring the correspondence between temperature and the information about the voltage difference between the auxiliary electrode and the first cathode comprises:
        determining a first correspondence between temperature and a color coordinate;
        determining a second correspondence between the color coordinate and the information about the voltage difference between the auxiliary electrode and the first cathode; and
        determining the correspondence between temperature and the information about the voltage difference between the auxiliary electrode and the first cathode according to the first correspondence and the second correspondence.

2. The control method of claim 1, wherein determining the voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode comprises:
    determining voltage adjustment information of the first cathode according to the current temperature information and the correspondence between temperature and the voltage information of the first cathode so that brightness of each first sub-pixel is unchanged; and determining voltage adjustment information of the auxiliary electrode according to the current temperature information, the voltage adjustment information of the first cathode, and the correspondence between temperature and the information about the voltage difference between the auxiliary electrode and the first cathode.

3. The control method of claim 2, wherein the voltage difference between the auxiliary electrode and the first cathode is V1 at a first temperature TI, the voltage difference between the auxiliary electrode and the first cathode is V2 at a second temperature T2, wherein T1<T2 and V1<V2.

4. The control method of claim 1, wherein each first sub-pixel further comprises a light emitting layer located between the first cathode and the first anode, and the light emitting layer comprises a plurality of light emitting sub-layers stacked;

each first sub-pixel comprises a blue sub-pixel;
the first correspondence satisfies that $CIE=a1*T^2+b1*T+c1$, where CIE denotes the color coordinate, T denotes temperature, and a1, b1 and c1 are constants related to a material and a structure of the light emitting layer;
the second correspondence satisfies that $CIE=d1*V+e1$, where CIE denotes the color coordinate, V denotes the voltage difference between the auxiliary electrode and the first cathode, and d1 and e1 are constants related to the material and the structure of the light emitting layer; and
the correspondence between temperature and the information about the voltage difference between the auxiliary electrode and the first cathode satisfies that $V2=V1+(a1*(T2^2-T1^2)+b1*(T2-T1))/d1$, where V1 denotes a voltage difference between the auxiliary electrode and the first cathode at a first temperature T1, and V2 denotes a voltage difference between the auxiliary electrode and the first cathode at a second temperature T2.

5. The control method of claim 1, wherein each first sub-pixel further comprises a light emitting layer located between the first cathode and the first anode, and the light emitting layer comprises a plurality of light emitting sub-layers stacked;

each first sub-pixel comprises a red sub-pixel and a green sub-pixel;
the first correspondence satisfies that $CIE=a2*T+b2$, where CIE denotes the color coordinate, T denotes temperature, and a2 and b2 are constants related to a material and a structure of the light emitting layer;
the second correspondence satisfies that $CIE=c2*V+d2$, where CIE denotes the color coordinate, V denotes the voltage difference between the auxiliary electrode and the first cathode, and c2 and d2 are constants related to the material and the structure of the light emitting layer; and
the correspondence between temperature and the information about the voltage difference between the auxiliary electrode and the first cathode satisfies that $V2=V1+(a2*(T2-T1))/c2$, where V1 denotes a voltage difference between the auxiliary electrode and the first cathode at a first temperature T1, and V2 denotes a voltage difference between the auxiliary electrode and the first cathode at a second temperature T2.

6. The control method of claim 1, wherein acquiring the correspondence between temperature and the voltage information of the first cathode comprises:

fixing brightness of each first sub-pixel and keeping a voltage of the first anode unchanged to acquire voltage information of the first cathode at different temperatures; and
repeating fixing the brightness of the each first sub-pixel and keeping the voltage of the first anode unchanged to acquire the voltage information of the first cathode at different temperatures, and adjusting the brightness of the each first sub-pixel so that the correspondence between temperature and the voltage information of the first cathode under different brightness of the first sub-pixel is obtained.

7. The control method of claim 1, wherein acquiring the current temperature information of the display panel comprises:

acquiring current voltage information of the second cathode, wherein the current voltage information of the second cathode is the same as current voltage information of the first cathode; and
determining the current temperature information of the display panel according to the current voltage information of the second cathode and the correspondence between temperature and the voltage information of the first cathode.

8. A display panel, comprising
a first driver chip, a plurality of first sub-pixels and an auxiliary electrode which are disposed in a display region, wherein each first sub-pixel comprises a first cathode and a first anode; and
a plurality of second sub-pixels and a second driver chip which are disposed in a temperature sensing region, wherein the temperature sensing region is located on at least one side of the display region, each second sub-pixel comprises a second cathode, and the second cathode is electrically connected to the first cathode; wherein
the second driver chip is configured to acquire a correspondence between temperature and voltage information of the first cathode, acquire a correspondence between temperature and information about a voltage difference between the auxiliary electrode and the first cathode, acquire current temperature information of the display panel, determine voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode, and send the voltage adjustment information of the first cathode and the auxiliary electrode to the first driver chip; and
the first driver chip is configured to receive the voltage adjustment information of the first cathode and the auxiliary electrode and adjust the voltage difference between the first cathode and the auxiliary electrode according to the voltage adjustment information of the first cathode and the auxiliary electrode so that a color purity change of the plurality of first sub-pixels meets a preset requirement;
wherein acquiring the correspondence between temperature and the information about the voltage difference between the auxiliary electrode and the first cathode comprises:
determining a first correspondence between temperature and a color coordinate;

determining a second correspondence between the color coordinate and the information about the voltage difference between the auxiliary electrode and the first cathode; and determining the correspondence between temperature and the information about the voltage difference between the auxiliary electrode and the first cathode according to the first correspondence and the second correspondence.

9. A display device, comprising a display panel, wherein the display panel comprises:

a first driver chip, a plurality of first sub-pixels and an auxiliary electrode which are disposed in a display region, wherein each first sub-pixel comprises a first cathode and a first anode; and a plurality of second sub-pixels and a second driver chip which are disposed in a temperature sensing region, wherein the temperature sensing region is located on at least one side of the display region, each second sub-pixel comprises a second cathode, and the second cathode is electrically connected to the first cathode; wherein the second driver chip is configured to acquire a correspondence between temperature and voltage information of the first cathode, acquire a correspondence between temperature and information about a voltage difference between the auxiliary electrode and the first cathode, acquire current temperature information of the display panel, determine voltage adjustment information of the first cathode and the auxiliary electrode according to the current temperature information, the correspondence between temperature and the voltage information of the first cathode, and the correspondence between temperature and the information about the voltage difference between the auxiliary electrode and the first cathode, and send the voltage adjustment information of the first cathode and the auxiliary electrode to the first driver chip; and the first driver chip is configured to receive the voltage adjustment information of the first cathode and the auxiliary electrode and adjust the voltage difference between the first cathode and the auxiliary electrode according to the voltage adjustment information of the first cathode and the auxiliary electrode so that a color purity change of the plurality of first sub-pixels meets a preset requirement;

wherein acquiring the correspondence between temperature and the information about the voltage difference between the auxiliary electrode and the first cathode comprises:

determining a first correspondence between temperature and a color coordinate;

determining a second correspondence between the color coordinate and the information about the voltage difference between the auxiliary electrode and the first cathode; and determining the correspondence between temperature and the information about the voltage difference between the auxiliary electrode and the first cathode according to the first correspondence and the second correspondence.

* * * * *